(12) United States Patent
Wang et al.

(10) Patent No.: US 10,957,590 B2
(45) Date of Patent: Mar. 23, 2021

(54) METHOD FOR FORMING A LAYER

(71) Applicant: Applied Materials, Inc., Santa Clara, CA (US)

(72) Inventors: Wenhui Wang, San Jose, CA (US); Huixiong Dai, San Jose, CA (US); Christopher S. Ngai, Burlingame, CA (US); Liqi Wu, San Jose, CA (US); Wenyu Zhang, San Jose, CA (US); Yongmei Chen, San Jose, CA (US); Hao Chen, Santa Clara, CA (US); Keith Tatseun Wong, Los Gatos, CA (US); Ke Chang, Singapore (SG)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/669,082

(22) Filed: Oct. 30, 2019

(65) Prior Publication Data

US 2020/0161181 A1    May 21, 2020

Related U.S. Application Data

(60) Provisional application No. 62/768,573, filed on Nov. 16, 2018.

(51) Int. Cl.
*H01L 21/768* (2006.01)
*H01L 23/535* (2006.01)
(Continued)

(52) U.S. Cl.
CPC .... *H01L 21/76897* (2013.01); *H01L 21/0228* (2013.01); *H01L 21/02178* (2013.01);
(Continued)

(58) Field of Classification Search
CPC ..................... H01L 21/76834; H01L 21/31144
See application file for complete search history.

(56) References Cited

U.S. PATENT DOCUMENTS 9,177,820 B2   11/2015   Elergenclahl et al.
9,741,566 B2    8/2017   Tang et al.
(Continued)

FOREIGN PATENT DOCUMENTS

KR   10-2005-0079731 A   8/2005
KR   10-2018-0075589 A   7/2018

OTHER PUBLICATIONS

International Search Report and Written Opinion for International Application No. PCT/US2019/057997 dated Feb. 13, 2020.

*Primary Examiner* — Farun Lu
(74) *Attorney, Agent, or Firm* — Patterson + Sheridan, LLP

(57) ABSTRACT

Implementations of the present disclosure generally relate to the fabrication of integrated circuits, and more particularly, to methods for forming a layer. The layer may be a mask used in lithography process to pattern and form a trench. The mask is formed over a substrate having at least two distinct materials by a selective deposition process. The edges of the mask are disposed on an intermediate layer formed on at least one of the two distinct materials. The method includes removing the intermediate layer to form a gap between edges of the mask and the substrate and filling the gap with a different material than the mask or with the same material as the mask. By filling the gap with the same or different material as the mask, electrical paths are improved.

12 Claims, 6 Drawing Sheets

(51) Int. Cl.
    *H01L 21/02*     (2006.01)
    *H01L 21/033*     (2006.01)
    *H01L 21/311*     (2006.01)

(52) U.S. Cl.
    CPC .. *H01L 21/02181* (2013.01); *H01L 21/02186* (2013.01); *H01L 21/02189* (2013.01); *H01L 21/0332* (2013.01); *H01L 21/31144* (2013.01); *H01L 21/76805* (2013.01); *H01L 21/76834* (2013.01); *H01L 21/76895* (2013.01); *H01L 23/535* (2013.01)

(56) References Cited

U.S. PATENT DOCUMENTS

| | | |
|---|---|---|
| 2013/0299919 A1 | 11/2013 | Chen et al. |
| 2014/0010853 A1 | 1/2014 | Williams et al. |
| 2014/0302684 A1 | 10/2014 | Sekine et al. |
| 2015/0151329 A1 | 6/2015 | Kawanishi et al. |
| 2015/0155176 A1 | 6/2015 | Mignot et al. |
| 2017/0092533 A1 | 3/2017 | Chakraborty et al. |
| 2017/0256402 A1 | 9/2017 | Kaufman-Osborn et al. |
| 2020/0105591 A1* | 4/2020 | Lin .................. H01L 21/76801 |

* cited by examiner

METHOD FOR FORMING A LAYER

CROSS-REFERENCE TO RELATED APPLICATIONS

This application claims priority to U.S. Provisional Patent Application Ser. No. 62/768,573, filed on Nov. 16, 2018, which herein is incorporated by reference.

BACKGROUND

Field

Implementations of the present disclosure generally relate to the fabrication of integrated circuits, and more particularly, to methods for forming a layer.

Description of the Related Art

Reducing the size of integrated circuits (ICs) results in improved performance, increased capacity, and/or reduced cost. Shrinking transistor size, for example, allows for the incorporation of an increased number of memory or logic devices on a chip, lending to the fabrication of products with increased capacity. The drive for ever-more capacity, however, is not without issue.

In the manufacture of ICs, multi-gate transistors have become more prevalent as device dimensions continue to scale down. Scaling multi-gate transistors has not been without consequence, however. As the dimensions of these fundamental building blocks of microelectronic circuitry are reduced, and as the number of building blocks fabricated in a given region increases, the constraints on the lithographic processes used to pattern these building blocks becomes overwhelming.

Photolithography is commonly used to pattern ICs on a substrate. An exemplary feature of an IC is a line of a material which may be a metal, semiconductor, or insulator. Due to factors such as optics and light or radiation wavelength, however, photolithography techniques are restricted by a minimum pitch, below which a particular photolithographic technique may not reliably form features. Thus, the minimum pitch of a photolithographic technique can limit feature size reduction of ICs.

Processes such as self-aligned double patterning (SADP), self-aligned quadruple patterning (SAQP), and litho-etch-litho-etch (LELE) may be used for extending the capabilities of photolithographic techniques beyond the minimum pitch capabilities of existing lithographic equipment. Following the SADP, SAQP, or LELE process, multi-cut or block masks are placed over the lines and spaces generated by SADP, SAQP, or LELE processes to perform device patterning. As the feature size decreases, pitch and linewidth also decrease. Therefore, the precision of mask edge placement control needs to be improved. Equipment capable of meeting such tight geometric requirements are extremely expensive, and additionally, such tight geometric requirements also contribute to low production yields.

Therefore, there is a need for improved methods for forming a layer, such as a mask.

SUMMARY

Implementations of the present disclosure generally relate to the fabrication of integrated circuits, and more particularly, to methods for forming a layer. In one implementation, a device includes a first material having a first surface, a second material having a second surface, a mask disposed on the first surface, and the mask has an edge portion extending over the second surface. The device further includes a layer disposed between the edge portion and the second surface, and the layer is in contact with the edge portion and the second surface.

In another embodiment, a method for forming a semiconductor device includes forming a mask on a first surface of a first material by a selective deposition process, the mask having an edge portion extending over a second surface of a second material, and the edge portion is in contact with a self-assembled monolayer. The method further includes removing the self-assembled monolayer to expose the second surface of the second material and to form a gap between the edge portion of the mask and the second surface of the second material, forming a layer on the mask and the exposed second surface of the second material by an atomic layer deposition process, the gap being filled with the layer, and removing at least a portion of the layer to expose at least a portion of the second surface of the second material.

BRIEF DESCRIPTION OF THE DRAWINGS

So that the manner in which the above recited features of the present disclosure can be understood in detail, a more particular description of the disclosure, briefly summarized above, may be had by reference to implementations, some of which are illustrated in the appended drawings. It is to be noted, however, that the appended drawings illustrate only exemplary implementations and are therefore not to be considered limiting of its scope, and may admit to other equally effective implementations.

Figure 1A:
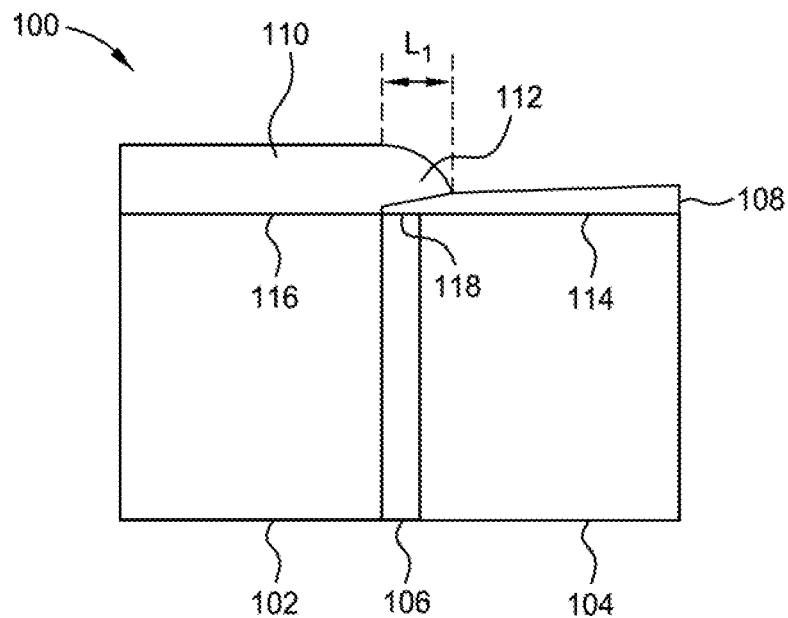
FIGS. 1A-1F illustrate schematic cross-sectional views of a portion of a substrate during different stages of forming a semiconductor device.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations of the present disclosure generally relate to the fabrication of integrated circuits, and more particularly, to methods for forming a layer. The layer may be a mask used in lithography process to pattern and form a trench. The mask is formed over a substrate having at least two distinct materials by a selective deposition process. The edges of the mask are disposed on an intermediate layer formed on at least one of the two distinct materials. The method includes removing the intermediate layer to form a gap between edges of the mask and the substrate and filling the gap with a different material than the mask or with the same material as the mask. By filling the gap with the same or different material as the mask, electrical paths are improved. Furthermore, the edges of the mask define the distance between two conductive materials, such as between a source/drain contact and a gate in a transistor, leading to improved self-aligned process.

FIGS. 1A-1F illustrate schematic cross-sectional views of a portion of a substrate 100 during different stages of forming a trench. As shown in FIG. 1A, the substrate 100 includes a first material 102, a second material 104, and a third material 106 disposed between the first material 102 and the second material 104. The first material 102 is an electrically conductive material, such as a metal. For example, the first material 102 may be cobalt, tungsten, or any suitable electrically conductive material. The first material 102 may be a gate or source/drain contact in a transistor. The second material 104 is a dielectric material, such as a carbide, an oxide or nitride. For example, the second material 104 may be silicon carbide, silicon oxycarbide, silicon nitride, tungsten carbide, or tungsten oxide. In some implementations, the first material 102 is a gate and the third material 106 is a work function layer, such as titanium nitride or tantalum nitride. In some implementations, the third material 106 is omitted, and the first material 102 is in contact with the second material 104.

The first material 102 has a surface 116, the second material 104 has a surface 114, and the third material has a surface 118. The surfaces 116, 114, and 118 may be co-planar, as shown in FIG. 1A. Alternatively, the surfaces 116, 114, and 118 may not co-planar, and this feature can be combined with one or more implementations described herein. A mask 110 is selectively deposited on the surface 116 of the first material 102 by a selective deposition process. The mask 110 is fabricated from a dielectric material, such as a high-k dielectric material. For example, the mask 110 may be fabricated from hafnium oxide, zirconium oxide, aluminum oxide, titanium oxide, or other suitable material. The selective deposition process for selectively deposit the mask 110 on the first material 102 includes deactivating surfaces 114 and 118 of the second material 104 and the third material 106, respectively. Deactivation of the surfaces 114 and 118 may be performed by forming a self-assembled monolayer (SAM) 108 on the surfaces 114 and 118. The SAM 108 may be fabricated from a material that has strong adhesion to the second material 104 and the third material 106 and weak adhesion to the first material 102. For example, the SAM 108 may include a carbon chain and a thiol terminal group. Due to the weak adhesion to the first material 102, the SAM 108 does not form on the surface 116 of the first material 102. The SAM 108 also deactivates the surfaces 114, 118 of the second material 104 and the third material 106, respectively. The mask 110 may be deposited by any suitable method, such as atomic layer deposition (ALD) or chemical vapor deposition (CVD), and the mask 110 is deposited on the surface 116 of the first material 102 and not on the SAM 108 due to the chemistry of the SAM 108 and the mask 110. However, the edge of the mask 110 can extend laterally over the SAM 108. Thus, the edge portion 112 of the mask 110 is disposed over the SAM 108, such as on and in contact with the SAM 108. The lateral dimension $L_1$ of the edge portion 112 of the mask 110 extends over the SAM 108 and can be controlled by the thickness of the mask 110. Thicker mask 110 leads to larger $L_1$ of the edge portion 112 of the mask 110 over the SAM 108. After the mask 110 is selectively deposited on the surface 116 of the first material 102, the SAM 108 is removed, leaving a gap between the edge portion 112 of the mask 110 and the surface 118 and/or surface 114.

Conventionally, a material is deposited on the mask 110 and a portion of the surface 114 of the second material 104 by a CVD process, and the gap between the edge portion 112 and the surface 118 and/or surface 114 is not filled. This gap can lead to weak electrical paths.

Figure 1B:
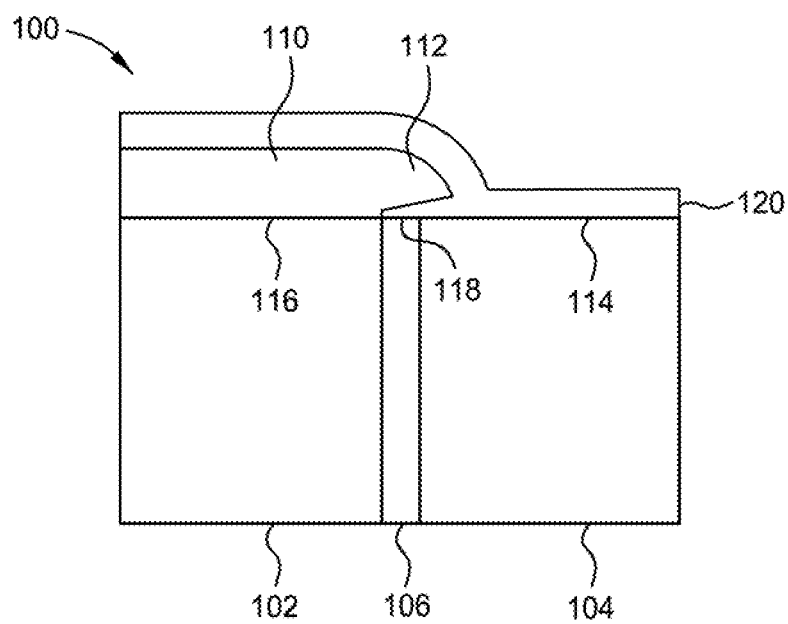
Figure 1C:
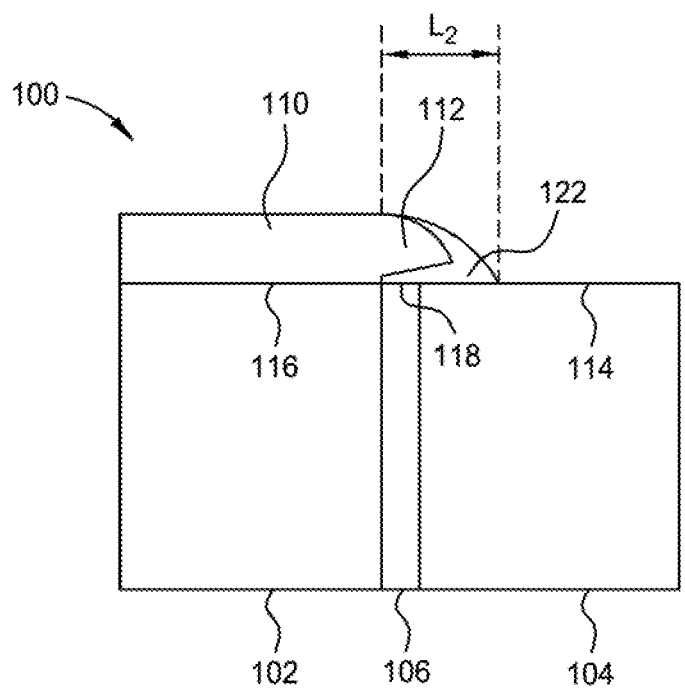

To improve electrical paths, a layer 120 is formed on the mask 110 and the surfaces 114, 118 of the second and third materials 104, 106, respectively, by an ALD process, as shown in FIG. 1B. The layer 120 may be fabricated from the same material as the mask 110. Because the ALD process has very good step coverage, the gap between the edge portion 112 and the surface 118 and/or surface 114 is filled with the layer 120. Next, as shown in FIG. 1C, a majority of the layer 120 is removed by an etching process to expose a portion of the surface 114 of the second material 104. The etching process removes portions of the layer 120 on the mask 110 and on the surface 114, but the etching process does not remove the portion of the layer 120 under the mask 110. As a result, a remaining portion 122 of the layer 120 between the edge portion 112 and the surface 118 and/or surface 114 is not removed by the etching process. The edge portion 112 and the remaining portion 122 of the layer 120 together have a lateral dimension $L_2$. The lateral dimension $L_2$ may be substantially the same as the lateral dimension $L_1$. In some applications, the lateral dimension $L_2$ defines the distance between two conductive materials, such as between a source/drain contact and a gate in a transistor, leading to improved self-aligned process.

Figure 1D:
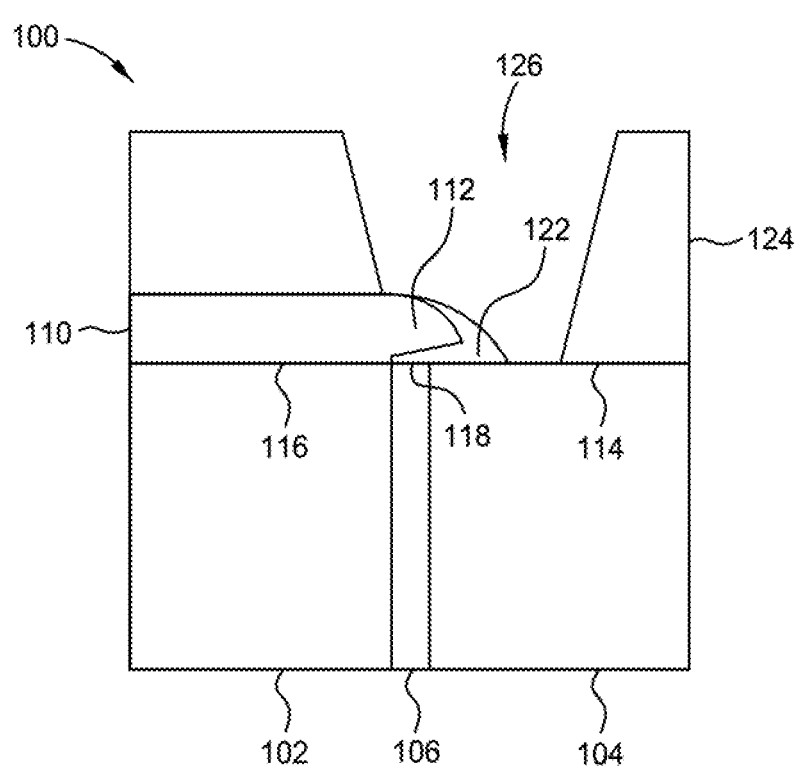
Figure 1E:
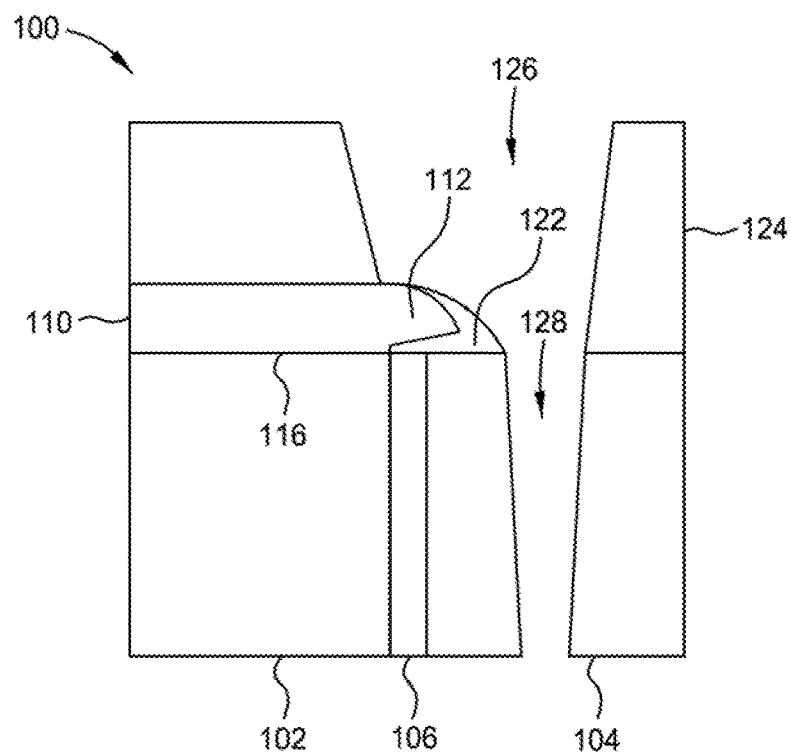
Figure 1F:
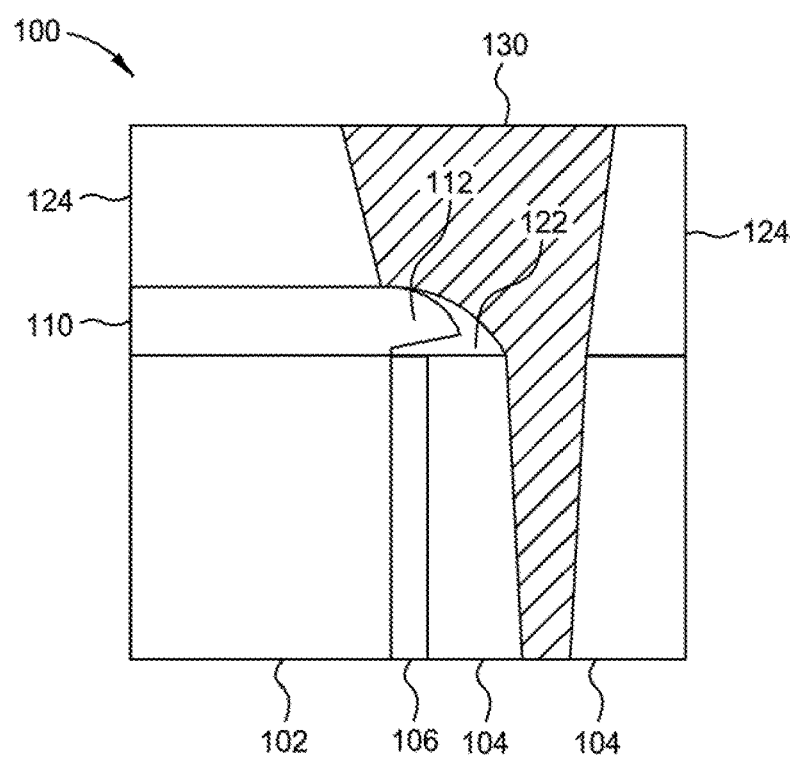

Next, as shown in FIG. 1D, a dielectric material 124 is formed on the mask 110 and the surface 114 of the second material 104, and a first trench 126 is formed to expose the edge portion 112 and at least a portion of the surface 114 of the second material 104. The dielectric material 124 may be the interlayer dielectric (ILD) and may be fabricated from a dielectric material, such as silicon oxide, silicon nitride, silicon oxynitride, or other suitable material. The first trench 126 may be formed by any suitable process, such as dry etching. Next, as shown in FIG. 1E, a second trench 128 is formed in the second material 104. The second trench 128 may be formed by any suitable process, such as dry etching. The first trench 126 and second trench 128 may be formed in one etching process or multiple etching processes. An electrically conductive material 130, such as a metal, may be deposited into trenches 126, 128, as shown in FIG. 1F. The electrically conductive material 130 in the second trench 128 is separated from the first material 102 by a distance substantially equal to the lateral dimension $L_2$. The substrate 100 shown in FIG. 1F may be a portion of a contact over active gate structure.

Figure 2A:
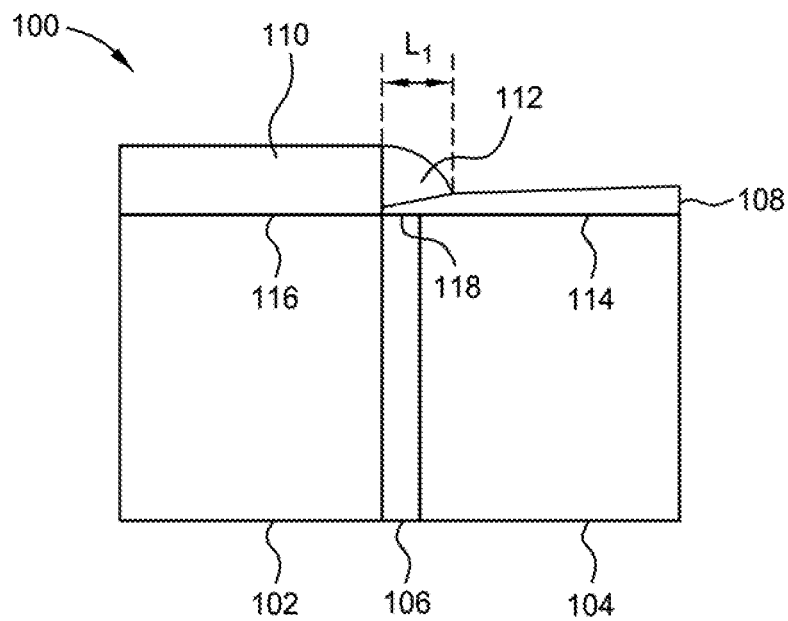
FIGS. 2A-2F illustrate schematic cross-sectional views of a portion of a substrate during different stages of forming a semiconductor device.

FIGS. 2A-2F illustrate schematic cross-sectional views of a portion of the substrate 100 during different stages of forming the second trench 128 according to alternative implementations, which can include and/or be combined with one or more implementations described herein. As shown in FIG. 2A, the substrate 100 includes the first material 102, the second material 104, and the third material 106 disposed between the first material 102 and the second material 104. The mask 110 having the edge portion 112 is selectively deposited on the surface 116 of the first material 102, and the edge portion 112 extends over the SAM 108 formed on the surface 118 and/or surface 114.

Figure 2B:
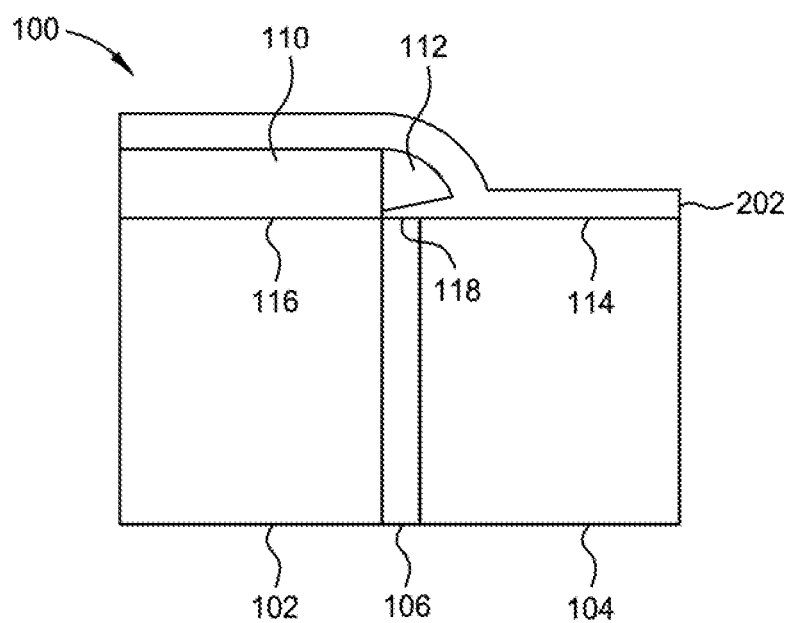

Next, as shown in FIG. 2B, the SAM 108 is removed, and a layer 202 is formed on the mask 110 and the surfaces 114, 118 of the second and third materials 104, 106, respectively, by an ALD process. Because of the ALD process, the gap between the edge portion 112 and the surface 118 and/or surface 114 is filled with the layer 202. Unlike the layer 120, which is fabricated from the same material as the mask 110, the layer 202 is fabricated from a material different from the mask 110. The layer 202 may be fabricated from a high-k dielectric material, such as hafnium oxide, zirconium oxide, aluminum oxide, titanium oxide, or other suitable material.

Figure 2C:
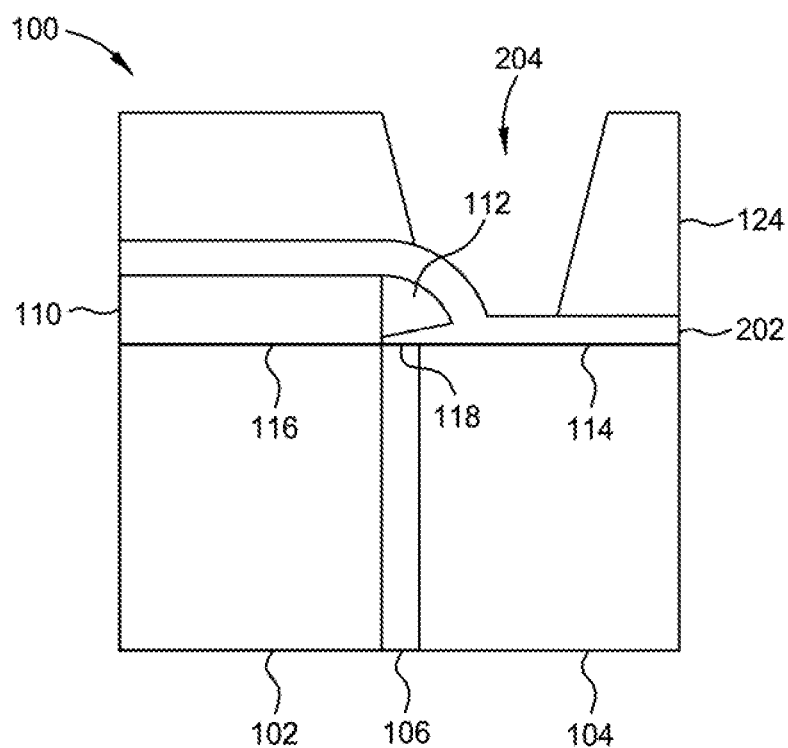
Figure 2D:
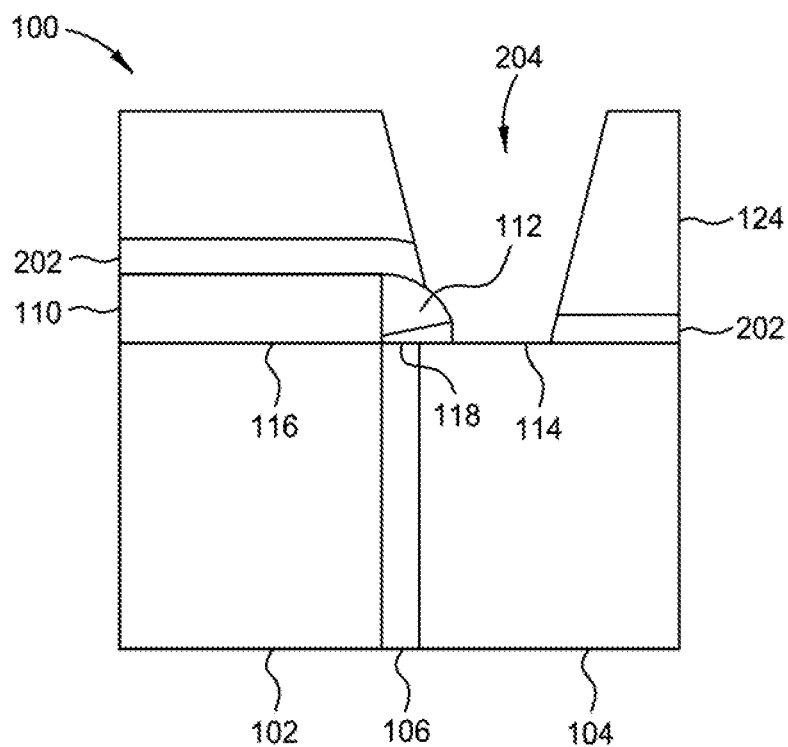
Figure 2E:
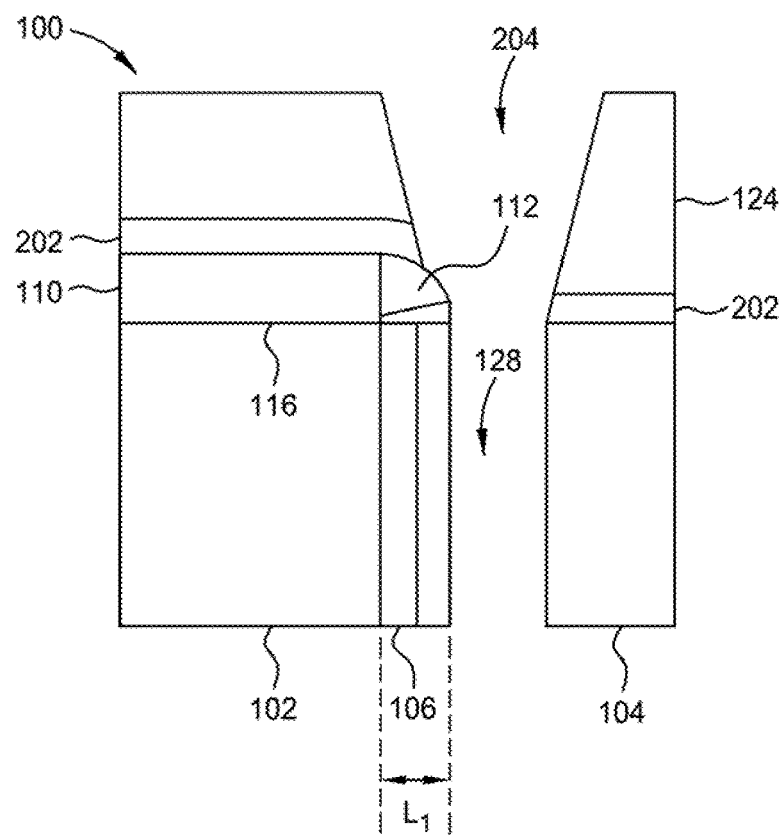
Figure 2F:
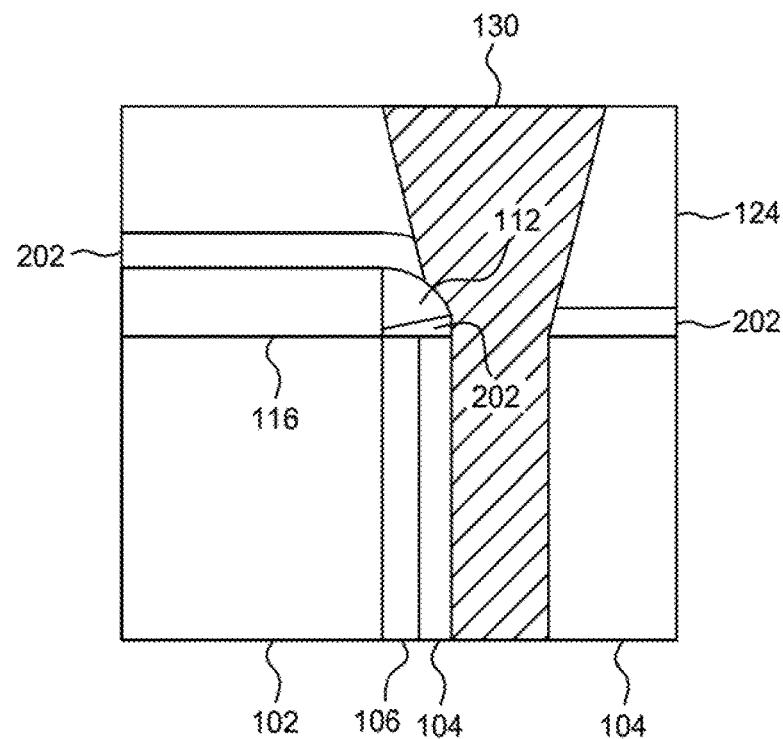

Next, as shown in FIG. 2C, the dielectric material 124 is formed on the layer 202, and a trench 204 is formed to expose a portion of the layer 202 disposed on the edge portion 112 and at least a portion of the surface 114 of the second material 104. The trench 204 may be formed by any suitable process, such as dry etching. The layer 202 may function as an etch stop layer for the etch process to form the trench 204. Next, as shown in FIG. 2D, the exposed portion of the layer 202 is removed to expose the edge portion 112 and at least a portion of the surface 114 of the second material 104. The exposed portion of the layer 202 may be removed by an etching process. The etching process may be a selective etching process, and the mask 110 may function as an etch stop layer due to the slower etch rate of the material of the mask 110 compared to the etch rate of the layer 202. The portion of the layer 202 disposed between the edge portion 112 and the surface 118 and/or surface 114 is protected by the edge portion 112 and not removed by the etching process. Next, the second trench 128 is formed in the second material 104, as shown in FIG. 2E. The electrically conductive material 130 is deposited into trenches 204, 128, as shown in FIG. 2F. The electrically conductive material 130 in the second trench 128 is separated from the first material 102 by a distance substantially equal to the lateral dimension $L_1$. The substrate 100 shown in FIG. 2F may be a portion of a contact over active gate structure.

In summary, a gap between a mask formed by a selective deposition process and a substrate is filled with a layer formed by an ALD process. The layer may be fabricated from the same material as the mask or different material than the mask. With the gap filled, electrical paths are improved.

While the foregoing is directed to implementations of the present disclosure, other and further implementations of the disclosure may be devised without departing from the basic scope thereof, and the scope thereof is determined by the claims that follow.

What is claimed is:

1. A method for forming a semiconductor device, the method comprising:
    forming a mask on a first surface of a first material by a selective deposition process, the mask having an edge portion extending over a second surface of a second material, the edge portion being in contact with a self-assembled monolayer;
    removing the self-assembled monolayer to expose the second surface of the second material and to form a gap between the edge portion of the mask and the second surface of the second material;
    forming a layer on the mask and the exposed second surface of the second material by an atomic layer deposition process, the gap being filled with the layer; and
    removing at least a portion of the layer to expose at least a portion of the second surface of the second material.

2. The method of claim 1, wherein the layer comprises the same material as the mask.

3. The method of claim 2, further comprising forming a dielectric material on the mask and the portion of the second surface.

4. The method of claim 3, further comprising forming a first trench in the dielectric material and a second trench in the second material.

5. The method of claim 4, further comprising depositing a first electrically conductive material in the first and second trenches.

6. The method of claim 1, wherein the layer comprises a different material than the mask.

7. The method of claim 6, further comprising forming a dielectric material on the layer prior to the removing the portion of the layer.

8. The method of claim 7, further comprising forming a first trench in the dielectric material to expose the portion of the layer prior to the removing the portion of the layer.

9. The method of claim 8, further comprising forming a second trench in the second material.

10. The method of claim 9, further comprising depositing a second electrically conductive material in the first and second trenches.

11. The method of claim 1, wherein the mask comprises hafnium oxide, zirconium oxide, aluminum oxide, or titanium oxide.

12. The method of claim 11, wherein the first material comprises cobalt or tungsten, and the second material comprises silicon carbide, silicon oxycarbide, silicon nitride, tungsten carbide, or tungsten oxide.

* * * * *